(12) United States Patent
Nakagawa

(10) Patent No.: US 6,887,097 B2
(45) Date of Patent: May 3, 2005

(54) TERMINAL FOR ELECTRICALLY CONNECTING BUTTON BATTERY

(75) Inventor: Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 97 days.

(21) Appl. No.: 10/366,479

(22) Filed: Feb. 14, 2003

(65) Prior Publication Data

US 2003/0162436 A1 Aug. 28, 2003

(30) Foreign Application Priority Data

Feb. 28, 2002 (JP) ........................................ 2002-053540

(51) Int. Cl.⁷ ................................................ H01R 3/00
(52) U.S. Cl. ...................................... 439/500; 439/884
(58) Field of Search ......................................... 439/500

(56) References Cited

U.S. PATENT DOCUMENTS 5,186,652 A * 2/1993 Hai-Yung ................... 439/500
5,900,332 A * 5/1999 Marukawa et al. ......... 429/158
5,931,693 A * 8/1999 Yamazaki .................... 439/500
5,993,248 A * 11/1999 Bethurum .................... 439/500

FOREIGN PATENT DOCUMENTS

JP  A-11-297289  5/1993

* cited by examiner

Primary Examiner—Truc T. T. Nguyen
(74) Attorney, Agent, or Firm—Posz & Bethards, PLC

(57) ABSTRACT

A button battery is installed in a electronic device such as a signal transmitter and electrically connected by a terminal contacting a flat electrode terminal of the button battery. The terminal has a circular spring-contact member surrounding a terminal base, and the spring-contact member is connected to the terminal base by a pair of connecting portions. The terminal base is fixed to a substrate by soldering. Since the spring-contact member is formed in a circular shape, its length can be made sufficiently long to make its spring modulus low and to reduce spring-load imposed thereon, thereby avoiding plastic deformation of the spring-contact member. The terminal base soldered to the substrate is prevented from being peeled off by eliminating twisting force applied to the spring-contact member.

20 Claims, 7 Drawing Sheets

TERMINAL FOR ELECTRICALLY CONNECTING BUTTON BATTERY

CROSS-REFERENCE TO RELATED APPLICATION

This application is based upon and claims benefit of priority of Japanese Patent Application No. 2002-53540 filed on Feb. 28, 2002, the content of which is incorporated herein by reference.

BACKGROUND OF THE INVENTION

1. Field of the Invention

The present invention relates to a terminal for electrically connecting a button battery in a signal transmitter or the like.

2. Description of Related Art

A conventional terminal for electrically connecting a button battery is shown in FIGS. 7A and 7B. The terminal 400 is made of a flat conductive plate and composed of a terminal base 410 and a pair of spring-contacts 420. The terminal base 410 is mounted on a substrate 20 by soldering. As shown in FIG. 7B, a button battery 30 having a minus-electrode flat terminal 31 and a plus-electrode terminal 32 is contained in a signal transmitter or the like. The pair of spring contacts 420 resiliently contacts the flat terminal 31.

A contact pressure between the spring-contacts 420 and the flat terminal 31 has to be set to a level that attains a good electrical connection. If the contact pressure is lower than a minimum pressure for attaining a good electrical contact (referred to as a required minimum contact pressure), a battery power is consumed in a contact resistance at the contacting point. A width W and a thickness t of the spring-contacts 420 are set to attain the required minimum contact pressure. A spring modulus of the spring contact is determined by the width W, the thickness t and a length L2 of the spring-contact 420. Because an amount of deflection of the spring-contact 420 also depends on its dimensional dispersion and other factors, the width W and the thickness t are set to secure the required minimum contact pressure even if the amount of deflection becomes low.

On the other hand, when the deflection amount of the spring-contact 420 becomes too large due to the dimensional dispersion or other factors, there is a possibility that the spring-contact 420 plastically deforms due to an internal stress exceeding a yield stress. The possibility of such plastic deformation increases as the spring modulus becomes high. Accordingly, it is preferable to set the spring modulus to a sufficiently low level by making the length L2 long. However, the length L2 cannot be made sufficiently long in the conventional structure of the spring contact 420 because it extends straight from the terminal base 410. It would be possible to make the spring modulus low by reducing the thickness t and narrowing the width W. In this case, however, the possibility of plastic deformation cannot be avoided because the internal bending stress in the spring-contact 420 becomes too large.

To cope with the afore-mentioned problem, a terminal 401 shown in FIG. 8 has been proposed. The terminal 401 is composed of a terminal base 411 and three curved spring-contacts 421 connected to the terminal base 411. It is possible to make a length L3 of the spring-contact 421 long and to make the spring modulus low by forming the spring contact 421 in a curved shape. However, another problem is involved in this structure. When the spring-contact 421 is bent by pushing the flat terminal 31 of the button battery 30 against the spring-contact 421, the spring-contact 421 deflects in a twisted manner. That is, a portion along line X-Y moves as a lever having a fulcrum at point Y. In other words, a large force is applied to point X due to deflection of the spring-contact 421. Accordingly, the terminal base 411 connected to the substrate by soldering will be peeled off from the substrate during a long time usage.

SUMMARY OF THE INVENTION

The present invention has been made in view of the above-mentioned problems, and an object of the present invention is to provide an improved terminal for a button battery, in which a possibility of plastic deformation and peeling off of a soldered portion is avoided.

A button battery is installed in an electronic device such as a keyless entry transmitter or a transmitter for sending signals for wirelessly operating a starter motor mounted an automotive vehicle. The button battery installed in the transmitter is electrically connected by a terminal. The terminal is composed of a terminal base, a spring-contact member and connecting portions connecting the spring-contact member to the terminal base. The terminal is formed by stamping a flat plate made of a resilient and conductive material.

The spring-contact member is formed in a circular shape surrounding the terminal base and includes contacting portions resiliently contacting a flat electrode terminal of the button battery. The base terminal connected to the spring-contact member by the connecting portions is fixed to a substrate by soldering or the like. Preferably, a pair of contacting portions is formed on the spring-contact member at symmetrical positions with respect to the terminal base. Preferably, the spring-contact member is connected to the base terminal by a pair of connecting portions positioned symmetrically with respect to the terminal base.

The spring-contact member may be formed in a polygonal shape such as an octagonal shape to minimize a material loss in a stamping process. The terminal base may be formed in a polygonal shape such as a rectangular shape to prevent rotation of the terminal base relative to the substrate in a reflow soldering process.

Since the spring-contact member is formed in a circular or polygonal shape surrounding the base terminal, its length can be made longer compared with a spring-contact extending straight from the terminal base. Accordingly, a spring modulus of the spring-contact member can be made sufficiently low, thereby reducing a spring-load imposed on the spring-contact member upon its deflection. Therefore, plastic deformation of the spring-contact member is effectively suppressed or avoided. Further, since no twisting force is applied to the spring-contact member upon its deflection, the base plate soldered to the substrate is prevented from being peeled off.

Other objects and features of the present invention will become more readily apparent from a better understanding of the preferred embodiment described below with reference to the following drawings.

DETAILED DESCRIPTION OF THE PREFERRED EMBODIMENT

Figure 1:
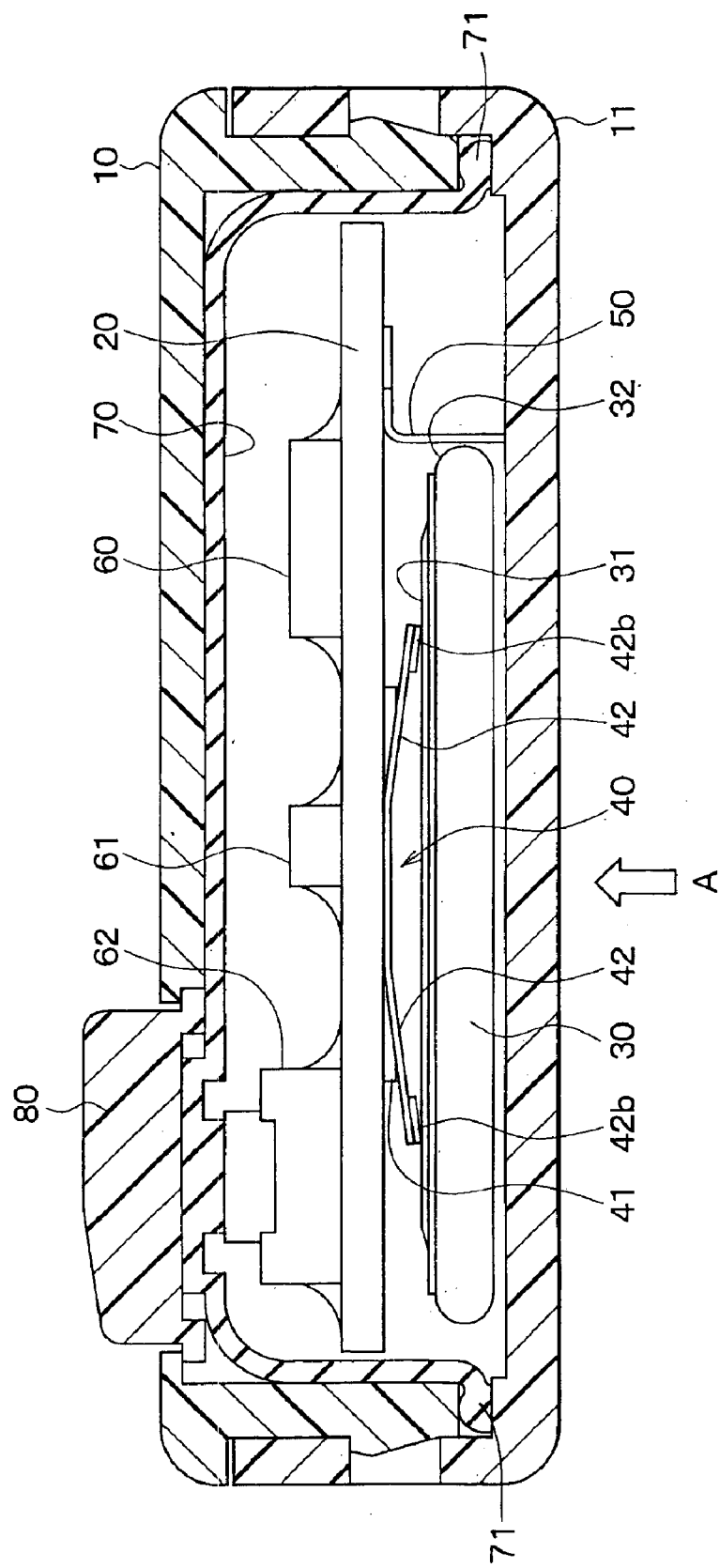
FIG. 1 is a cross-sectional view showing a keyless entry transmitter.

A preferred embodiment of the present invention will be described with reference to FIGS. 1–6. First, referring to FIG. 1, a keyless entry transmitter, in which a terminal for electrically connecting a button battery is used, will be described. The keyless entry transmitter is a transmitter for sending signals for wirelessly operating a door lock system installed in an automotive vehicle.

A printed circuit board substrate 20, on which electronic components, including an integrated circuit 60, a quartz oscillator 61 and a tact switch 62 are mounted, and a button battery 30 for supplying power to the electronic components are contained in a casing composed of an upper resin case 10 and a lower resin case 11. A terminal 40 contacting a minus-electrode flat terminal 31 of the button battery 30 is mounted on a rear surface of the substrate 20. Another terminal 50 contacting a plus-electrode terminal 32 of the button battery 30 is also connected to the rear surface of the substrate 20.

A waterproof packing 70 is disposed in the casing as shown in FIG. 1, and its lips 71 are sandwiched between the upper resin case 10 and the lower resin case 11 to prevent water from entering the casing. A push button 80 is disposed at an outside portion of the waterproof packing 70. The tact switch 62 is operated by pushing the push button 80, and electric power is supplied to electronic components from the button battery 30. The quartz oscillator 61 generates signals for locking or unlocking the door lock in response to pushing operation of the push button 80. The signals generated by the quartz oscillator 61 are wirelessly sent to the door lock system installed in an automobile.

Figure 2:
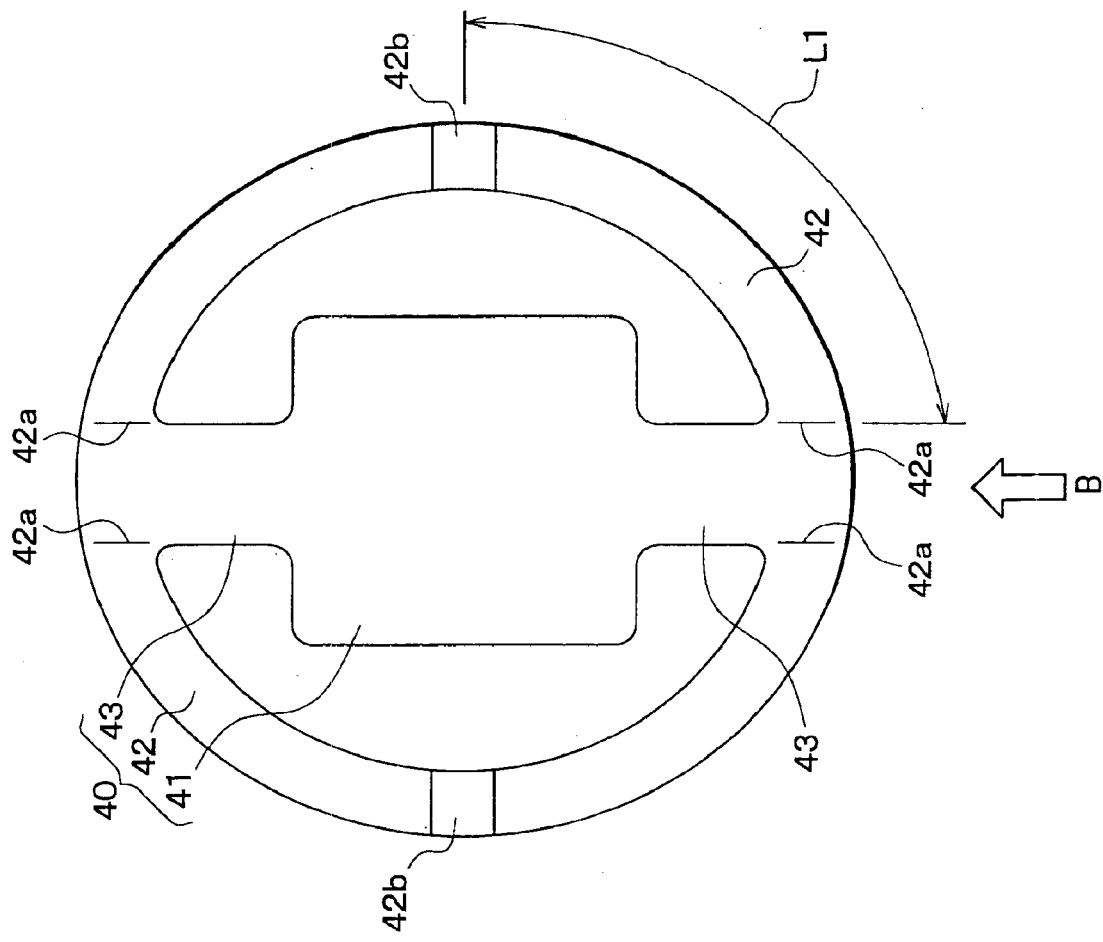
FIG. 2 is a plan view showing a terminal for electrically connecting a button battery in the keyless entry transmitter, viewed in direction A shown in FIG. 1.
Figure 3:
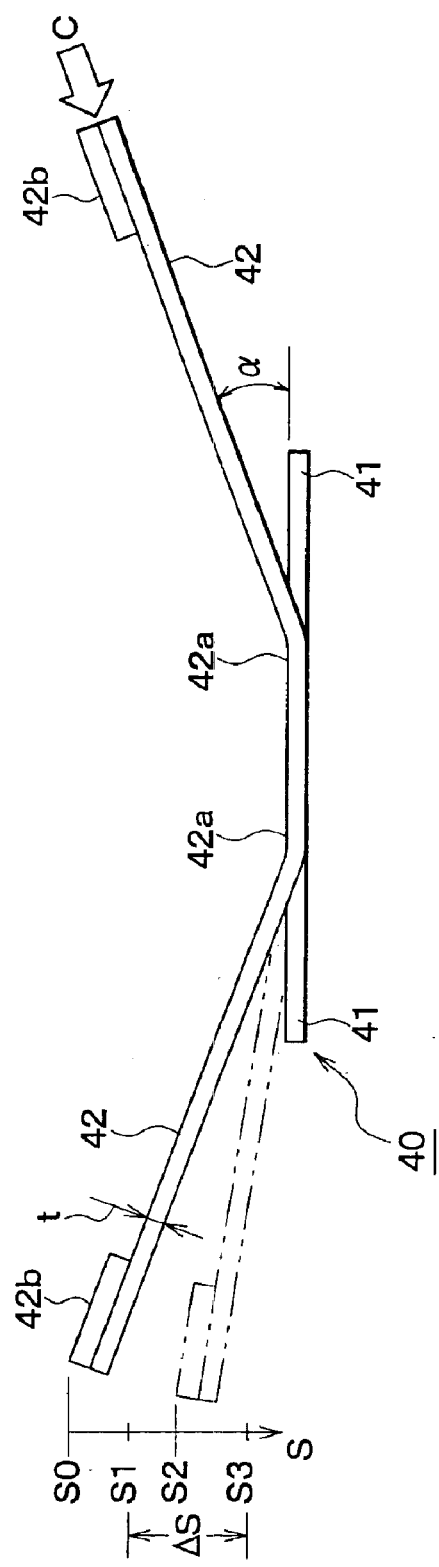
FIG. 3 is a side view showing the terminal, viewed in direction B shown in FIG. 2.
Figure 4:
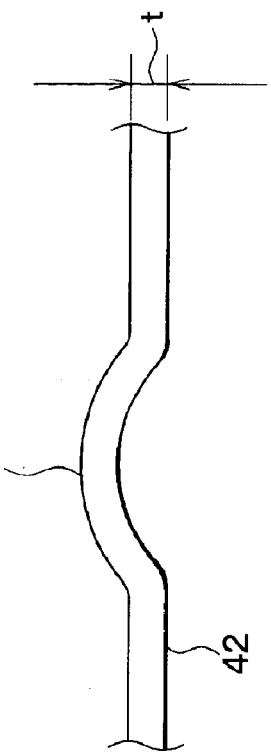
FIG. 4 is another side view showing the terminal, viewed in direction C shown in FIG. 3.

Now, referring to FIGS. 2–4, the terminal 40 contacting the flat terminal 31 of the button battery 30 will be described. FIG. 2 shows a plan view of the terminal 40, FIG. 3 shows its side view, viewed in direction B shown in FIG. 2, and FIG. 4 shows a side view of its contacting portion, viewed in direction C shown in FIG. 3. As shown in FIG. 2, the terminal 40 includes a terminal base 41, a circular spring-contact member 42, and a pair of connecting portions 43 connecting the spring-contact member 42 to the terminal base 41. The terminal 40 is formed by stamping a flat plate made of a copper alloy, such as phosphor bronze or beryllium copper, covered by nickel and plated with gold. The flat plate may be made of other materials such as silver-plated stainless steel having spring action. In this particular embodiment, a flat plate that is made of phosphor bronze covered with nickel and further plated with gold on nickel is used. It is preferable to use the flat plate having a thickness of 0.1–0.3 mm. In this particular embodiment, the flat plate having a 0.15 mm thickness is used.

The terminal base 41 is formed in a rectangular shape in this embodiment, but it may be formed in other polygonal shapes. The terminal base 41 is connected to the rear surface of the substrate 20 by soldering. The spring-contact member 42 is formed in a circular ring surrounding the terminal base 41 and is connected to the terminal base 41 by a pair of connecting portions 43. The pair of connecting portions 43 are positioned in line with each other and symmetrically with respect to the terminal base 41.

As shown in FIG. 3, the spring-contact member 42 is bent toward the button battery 30 at bent portions 42a, as shown in FIG. 3. A bending angle α is about 30° in this embodiment. The spring-contact member 42 resiliently deflects to a position shown with a chained line in FIG. 3 when it contacts the flat terminal 31 of the button battery 30. A pair of contacting portions 42b that contacts the flat terminal 31 of the button battery 30 is formed on the spring-contact member 42. The pair of contacting portions 42b is positioned symmetrically with respect to the terminal base 41, as shown in FIG. 2. Each contacting portion 42b is curved toward the button battery 30, as shown in FIG. 4.

If a contact pressure between the contacting portion 42b and the flat terminal 31 of the button battery 30 is lower than a required minimum pressure Fmin, a power loss occurs due to a contact resistance. The required minimum pressure Fmin defined as a contact pressure between each contacting portion 42b and the flat terminal 31 is 50 grams when a nickel-gold type button battery is used. In this embodiment, the nickel-gold type button battery 30 is used.

Figure 5:
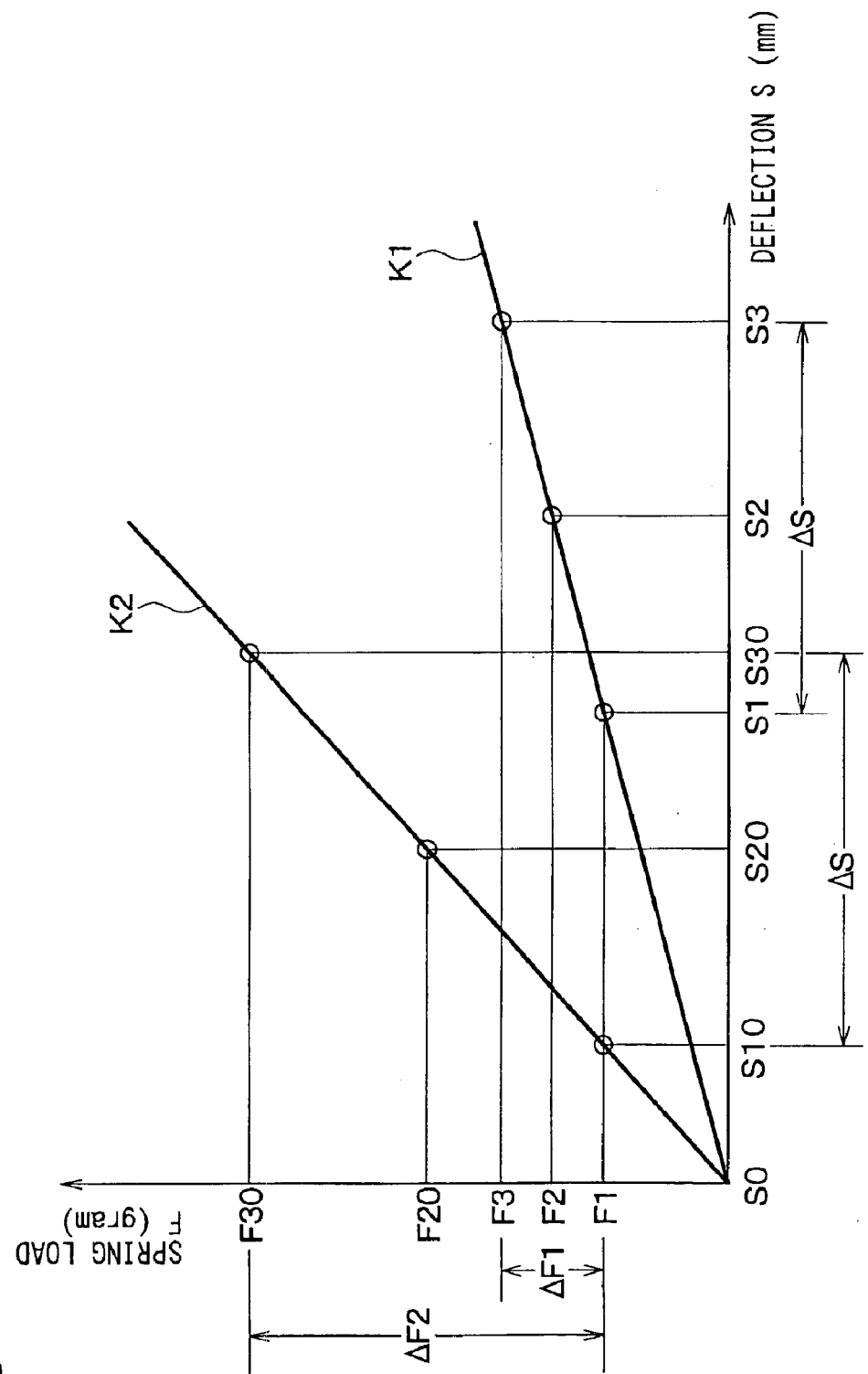
FIG. 5 is a graph showing a relation between an amount of deflection of a spring-contact and a spring-load imposed on the spring-contact.

FIG. 5 shows a spring characteristic, a relation between an amount of deflection S of a spring-contact member and a spring-load F applied thereto. A spring modulus of a spring-contact member is defined as an inclination angle of a line showing a spring-characteristic. Line K1 shows a spring characteristic of the spring-contact member 42 having a spring modulus K1 used in the present embodiment, and line K2 shows a spring characteristic of a spring-contact member having a spring modulus K2 which is larger than K1.

When the spring-contact member 42 is pressed against the flat terminal 31 of the button battery 30, it deflects by the amount of deflection S as shown in FIG. 3. The amount of deflection S is not always exactly constant, but it varies due to dimensional dispersion of the spring-contact member 42 or other factors. When the spring-contact member 42 is designed to deflect by an amount of S2 (a target amount of deflection), an actual amount of deflection varies in a range ΔS between S1 and S3. It is necessary to set the spring modulus K1 so that the required minimum pressure Fmin is attained even when the deflection amount is the smallest level, i.e., S1. Since a pair of contacting portions 42*b* is provided in this embodiment, the spring modulus K1 has to be set to attain a minimum spring-load F1 equal to (2×Fmin). Because the required minimum pressure Fmin is 50 grams in this embodiment as mentioned above, the minimum spring-load F1 is 100 grams.

Figure 7A:
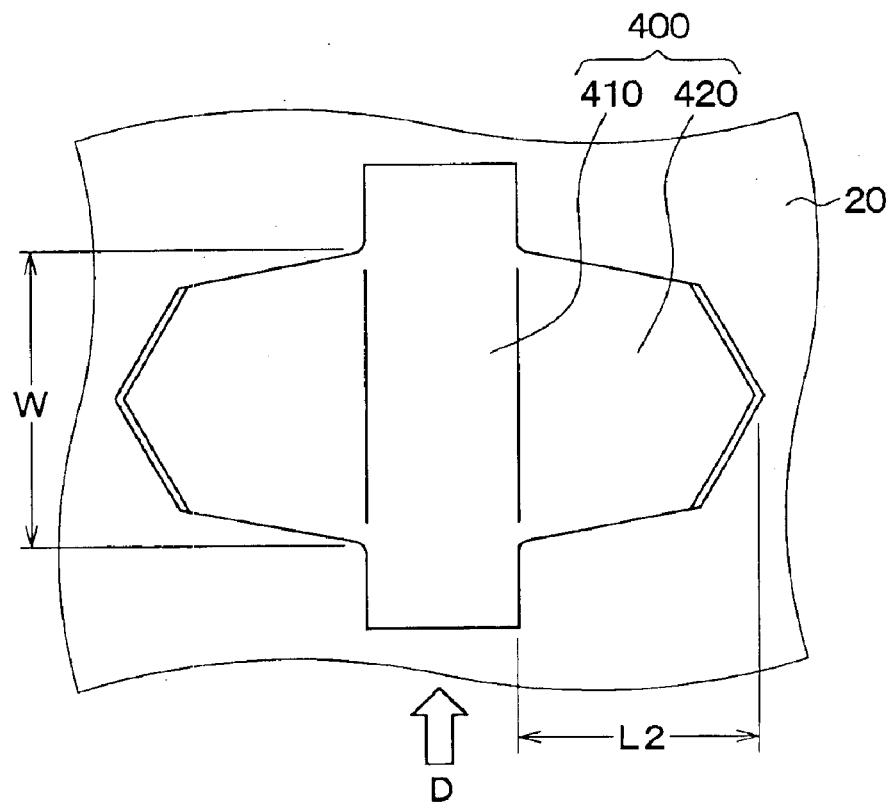
FIG. 7A is a plan view showing a conventional terminal for electrically connecting a button battery.
Figure 7B:
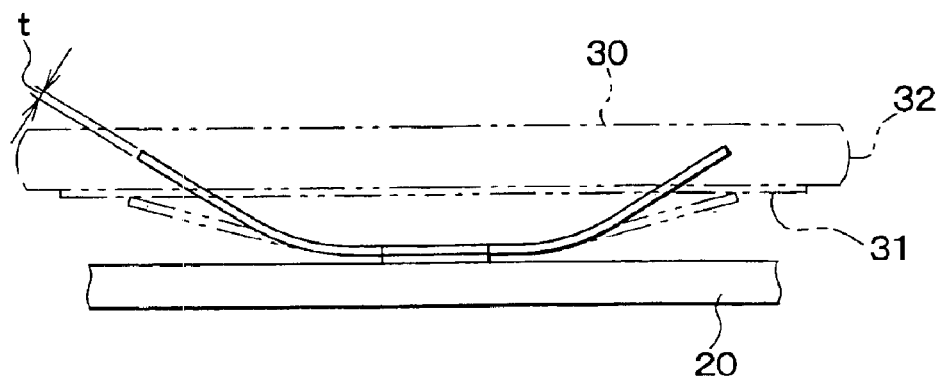
FIG. 7B is a side view showing the conventional terminal, viewed in direction D shown in FIG. 7A.

When the spring modulus is set to K1 to attain the spring-load F1 at the smallest deflection S1, the spring-load becomes F2 at the target deflection S2, and F3 at the largest deflection S3. The length L1 of the spring-contact member 42 is longer than the spring length L2 of the conventional spring-contact 420 shown in FIG. 7A, because the spring-contact member 42 is formed in a circular shape. Assuming that both of the spring-contact member 42 and the conventional spring-contact 420 are made of a same material having a same thickness, the spring modulus K2 of the conventional spring-contact 420 becomes higher than K1 because L2 is shorter than L1. The same level of the required minimum pressure Fmin is required also in the conventional spring-contact 420 at its smallest deflection S10. In the conventional spring-contact 420 attaining F1 at deflection S10 its spring-load becomes F20 at a target deflection S20 and F30 at a largest deflection S30.

Assuming the spring deflection S varies in the same range of ΔS in both of the conventional spring-contact and that of the present invention, a spring-load variation ΔF1 of the spring-contact member 42 of the present invention is smaller than ΔF2 of the conventional spring-contact 420. Therefore, the maximum spring-load F3 applied to the spring-contact member 42 of the present invention can be made much smaller than the maximum spring-load F30 applied to the conventional spring-contact 420. Accordingly, a possibility of the plastic deformation of the spring-contact member 42 is considerably reduced, compared with that of the conventional spring-contact 420.

Figure 8:
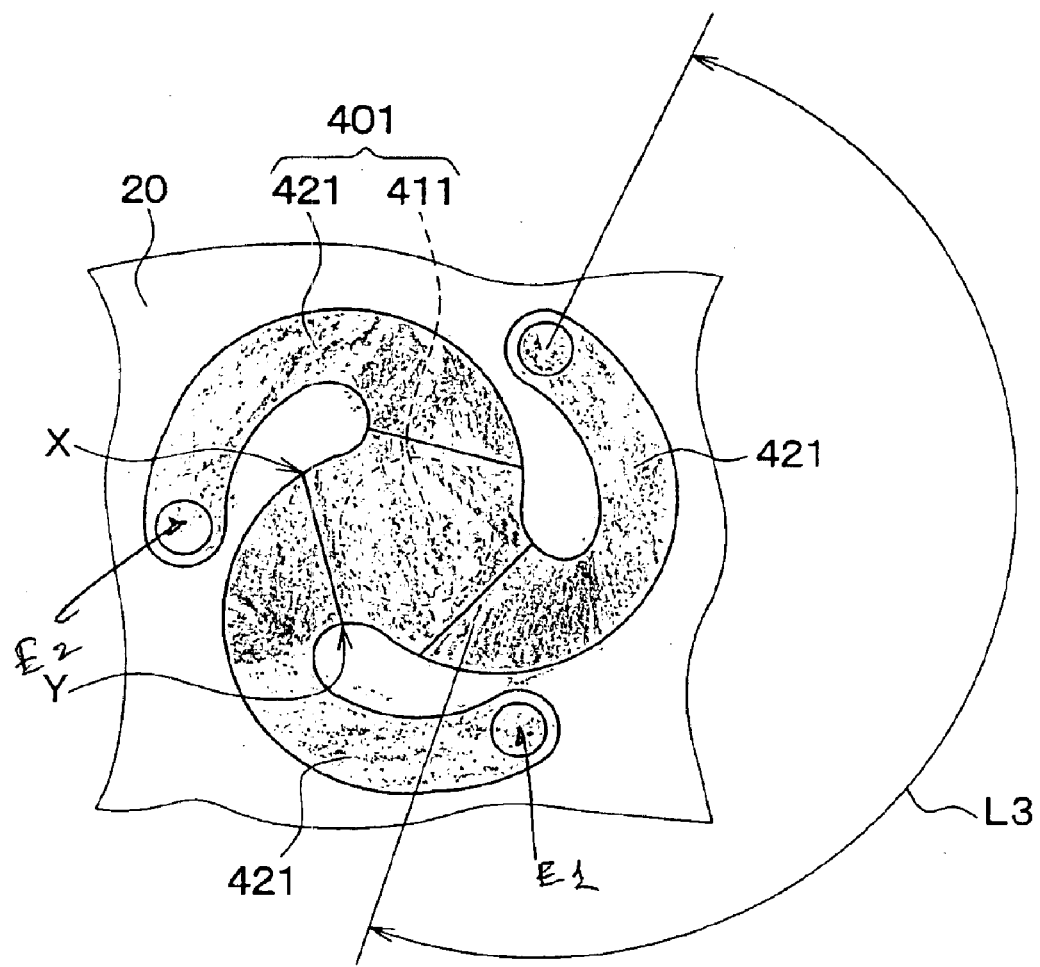
FIG. 8 is a plan view showing another conventional terminal.

Further, the problem of twisted deflection occurred in the spring-contact 421 shown in FIG. 8 is also avoided in the spring-contact member 42 of the present invention. Therefore, terminal base 41 that is soldered to the substrate 20 is not peeled off in a course of repeated deflection of the spring-contact member 42. Since the terminal base 41 is connected to the rear surface of the substrate 20 by soldering, the terminal 40 is easily and automatically mounted. Since the terminal base 41 is formed in a rectangular or polygonal shape, the terminal 40 does not rotate relative to the substrate 20 when it is soldered by reflow soldering.

Figure 6:
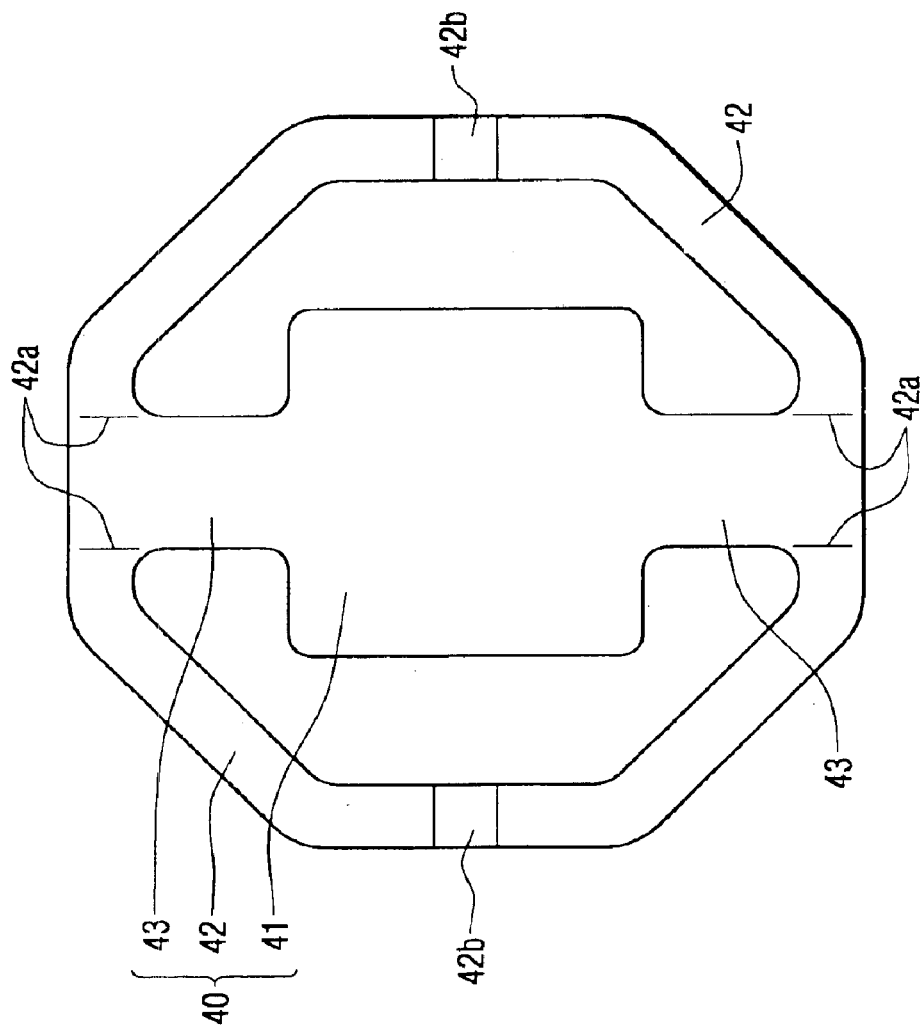
FIG. 6 is a plan view showing a modified form of the terminal shown in FIG. 1.

The present invention is not limited to the embodiment described above, but it may be variously modified. For example, the spring-contact member 42 may be formed in an octagonal shape as shown in FIG. 6. By forming the spring-contact member 42 in the octagonal shape, plural terminals 40 can be formed from a single mother plate, while minimizing a stamping loss in the mother plate. Though a pair of connecting portion 43 is formed in the embodiment described above, it is possible to form three or more connecting portions. Though a pair of contacting portions 42*b* is formed in the embodiment described above, three or more contacting portions may be made. Alternatively, a single contacting portion may be made at one position on the spring-contact member 42. Though the contacting portion 42*b* is formed in a curved projection, it may be made in a shape of a round projection to further reduce a contact resistance. Further, the terminal base 41 may be made in a circular shape. Though the terminal base 41 is connected to the substrate 20 by soldering, it may be mechanically connected to the substrate.

Though the terminal 40 is described as a terminal for electrically connecting a button battery in a keyless entry transmitter, the terminal 40 according to the present invention may be used in other devices such as a transmitter for wirelessly sending signals for operating a starter motor mounted on an automobile.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A terminal for electrically connecting a button battery, the terminal comprising:

a terminal base for mounting the terminal on a substrate;

a spring-contact member continuously encircling the terminal base, the spring contact member being adapted to resiliently contact a flat electrode terminal of the button battery; and connecting portions connecting the spring-contact member to the terminal base, wherein the terminal base, the spring-contact member and the connecting portions are integrally formed from a conductive flat plate.

2. The terminal as in claim 1, wherein the spring-contact member is formed in a circular shape.

3. The terminal as in claim 1, wherein the spring-contact member is formed in a polygonal shape.

4. The terminal as in claim 1, wherein the terminal base is formed in a polygonal shape.

5. The terminal as in claim 1, wherein the spring-contact member is connected to the terminal base by a pair of connecting portions, and the connecting portions are disposed symmetrically with respect to the terminal base.

6. The terminal as in claim 1, wherein the terminal base is mounted on the substrate by solder.

7. The terminal as in claim 1, wherein the terminal is used in a keyless entry transmitter for wirelessly operating a door-lock system installed in an automotive vehicle.

8. The terminal as in claim 1, wherein the terminal is used in a transmitter for wirelessly operating a starter motor for cranking an automotive engine.

9. A terminal for electrically connecting a button battery, the terminal comprising:

a terminal base for mounting the terminal on a substrate;

a spring-contact member continuously encircling the terminal base;

connecting portions connecting the spring-contact member to the terminal base, the connecting portions being disposed symmetrically with respect to the terminal base; and contacting portions formed on the spring-contact member, so that the contacting portions resiliently contact a flat electrode terminal of the button battery, wherein the terminal base, the spring-contact member, the connecting portions and the contacting portions are all integrally formed from a conductive flat plate.

10. The terminal as in claim 9, wherein the contacting portions are disposed symmetrically with respect to a center of the terminal base.

11. The terminal as in claim 9, wherein the terminal base is formed in a polygonal shape.

12. The terminal as in claim 9, wherein a pair of contacting portions is formed on the spring-contact member.

13. The terminal as in claim 9, wherein the terminal base is mounted on the substrate by solder.

14. The terminal as in claim 9, wherein the terminal is used in a keyless entry transmitter for wirelessly operating a door-lock system installed in an automotive vehicle.

15. The terminal as in claim 9, wherein the terminal is used in a transmitter for wirelessly operating a starter motor for cranking an automotive engine.

16. A terminal for electrically connecting a button battery, wherein the terminal comprises:

a terminal base for mounting the terminal on a substrate;

an annular spring-contact member, which continuously surrounds the terminal base, wherein the spring contact member is constructed and arranged to resiliently contact a flat electrode terminal of the button battery; and connecting portions, which connect the spring-contact member to the terminal base, wherein the terminal base, the spring-contact member and the connecting portions are integrally formed from a conductive flat plate.

17. The terminal according to claim 16, wherein the shape of the terminal base is polygonal.

18. The terminal according to claim 16, wherein the spring-contact member is connected to the terminal base by two connecting portions, which are symmetrically arranged with respect to the terminal base.

19. The terminal according to claim 16, wherein the terminal is part of a keyless entry transmitter for wirelessly operating a door-lock system installed in an automotive vehicle.

20. The terminal according to claim 16, wherein the terminal is used in a transmitter for wirelessly operating a starter motor for cranking an automotive engine.

* * * * *